(12) United States Patent
Yoshikawa et al.

(10) Patent No.: US 9,954,152 B2
(45) Date of Patent: Apr. 24, 2018

(54) METHOD FOR PRODUCING SEMICONDUCTOR LIGHT-EMITTING DEVICE

(71) Applicant: Sumitomo Chemical Company, Limited, Chuo-ku, Tokyo (JP)

(72) Inventors: Gaku Yoshikawa, Osaka (JP); Masayuki Takashima, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/329,280

(22) PCT Filed: Jul. 27, 2015

(86) PCT No.: PCT/JP2015/071279
§ 371 (c)(1),
(2) Date: Jan. 26, 2017

(87) PCT Pub. No.: WO2016/017593
PCT Pub. Date: Feb. 4, 2016

(65) Prior Publication Data
US 2017/0229622 A1    Aug. 10, 2017

(30) Foreign Application Priority Data

Jul. 28, 2014    (JP) .................. 2014-152879

(51) Int. Cl.
*H01L 33/56*    (2010.01)
*H01L 33/50*    (2010.01)
*C08L 83/04*    (2006.01)

(52) U.S. Cl.
CPC ............ *H01L 33/56* (2013.01); *H01L 33/502* (2013.01); *C08L 83/04* (2013.01); *H01L 2933/005* (2013.01)

(58) Field of Classification Search
CPC . H01L 33/56; H01L 33/502; H01L 2933/005; C08L 83/04
See application file for complete search history.

(56) References Cited

U.S. PATENT DOCUMENTS

2003/0232943 A1    12/2003    Sang et al.
2011/0269918 A1*  11/2011    Hamamoto ............. H01L 33/56
525/478
(Continued)

FOREIGN PATENT DOCUMENTS

JP    2007291273 A    11/2007
JP    2009-164636 A    7/2009
(Continued)

OTHER PUBLICATIONS

Int'l Search Report dated Oct. 6, 2015 in Int'l Application No. PCT/JP2015/071279.
(Continued)

*Primary Examiner* — Marvin Payen
*Assistant Examiner* — Jeremy Joy
(74) *Attorney, Agent, or Firm* — Panitch Schwarze Belisario & Nadel LLP

(57) ABSTRACT

A method for producing a semiconductor light-emitting device involves applying a silicone resin composition to a surface of a semiconductor light-emitting element and forming an encapsulating portion covering the surface of the light-emitting element by heat curing the applied resin composition. The silicone resin composition contains at least 60% by mass of a silicone resin in which the constituent silicon atoms are substantially only silicon atoms to which three oxygen atoms are bonded. The heat curing satisfies 5<a−b<20, in which "a cm$^{-1}$" is an infrared absorption spectrum peak position assigned to Si—O—Si linkages in a range from 1,000 to 1,050 cm$^{-1}$ of the silicone resin before the heat curing and "b cm$^{-1}$" is an infrared absorption (Continued)

spectrum peak position assigned to Si—O—Si linkages in a range from 950 to 1,050 $cm^{-1}$ of the silicone resin composition after the heat curing.

3 Claims, 1 Drawing Sheet

(56) References Cited

U.S. PATENT DOCUMENTS

| | | | |
|---|---|---|---|
| 2011/0309328 A1* | 12/2011 | Kyono | B82Y 20/00 257/13 |
| 2012/0043577 A1* | 2/2012 | Imazawa | C08L 83/04 257/99 |
| 2013/0299796 A1* | 11/2013 | Masuyama | B29C 33/3857 257/40 |
| 2013/0320264 A1* | 12/2013 | Yoshida | H01L 33/501 252/301.36 |

FOREIGN PATENT DOCUMENTS

| | | | |
|---|---|---|---|
| JP | 2011-111468 A | | 6/2011 |
| JP | 2011-246680 A | | 12/2011 |
| JP | 2011246680 A | * | 12/2011 |
| JP | 2011246680 A | * | 12/2011 |
| JP | 2012-041496 A | | 3/2012 |
| WO | 2012119615 A1 | | 9/2012 |

OTHER PUBLICATIONS

Extended Search Report dated Jan. 2, 2018 EP Application No. 15826730.2.

* cited by examiner

US 9,954,152 B2

METHOD FOR PRODUCING SEMICONDUCTOR LIGHT-EMITTING DEVICE

CROSS-REFERENCE TO RELATED APPLICATION

This application is a Section 371 of International Application No. PCT/JP2015/071279, filed Jul. 27, 2015, which was published in the Japanese language on Feb. 4, 2016 under International Publication No. WO 2016/017593 A1, and the disclosure of which is incorporated herein by reference.

TECHNICAL FIELD

The present invention relates to a method for producing a semiconductor light-emitting device.

Priority is claimed on Japanese Patent Application No. 2014-152879, filed Jul. 28, 2014, the content of which is incorporated herein by reference.

BACKGROUND ART

In recent years, cured products of silicone resin compositions have been proposed for use as encapsulating materials for semiconductor light-emitting elements. However, the cured products of silicone resin compositions tend to exhibit high gas permeability and low barrier properties relative to hydrogen sulfide gas in the air. As a result, when encapsulating is performed using a cured product of a silicone resin composition, a problem arises in that the silver film that functions as the rear reflector of the encapsulated semiconductor light-emitting element may be corroded by hydrogen sulfide in the air, causing a deterioration in the brightness of the semiconductor light-emitting element.

A curable silicone resin composition containing a silicone resin having a refractive index following curing of 1.50 to 1.55 and a silicon oxide filler having an average particle size of 1 to 10 µm that is dispersed uniformly in the silicone resin at a concentration of 1 to 30% by mass has been proposed as a silicone resin composition capable of addressing the above problem (see Patent Document 1).

PRIOR ART LITERATURE

Patent Documents

Patent Document 1: JP-2012-41496-A

DISCLOSURE OF INVENTION

Problems to be Solved by the Invention

However, the silicone resin composition disclosed in Patent Document 1 has unsatisfactory crack resistance and heat resistance in some cases.

The present invention has been developed in light of the above problem, and has an object of providing a method for producing an optical semiconductor light-emitting device which provides an encapsulating portion of improved crack resistance and heat resistance formed from a cured product of a silicone resin composition.

Means for Solving the Problems

The inventors of the present invention discovered that when a silicone resin composition is heat cured, the position of a prescribed peak in the infrared absorption spectrum assigned to Si—O—Si linkages changes. Moreover, they also discovered that by using a specific silicone resin composition as a material, and controlling within a prescribed range the amount of change in the position of the above peak upon heat curing of the silicone resin composition, the crack resistance and the heat resistance of the cured product of the silicone resin composition (namely, the encapsulating portion of the optical semiconductor light-emitting device or the optical semiconductor encapsulating member) could be improved, and they were therefore able to complete the present invention.

In other words, one aspect of the present invention provides a method for producing a semiconductor light-emitting device comprises a step of heat curing a silicone resin composition applied to a surface of a semiconductor light-emitting element, thereby forming an encapsulating portion provided covering the surface of the semiconductor light-emitting element, wherein the silicone resin composition comprises a silicone resin in which the constituent silicon atoms are substantially only silicon atoms to which three oxygen atoms are bonded in an amount of 60% by mass or more, and the heat curing is performed under conditions in which an infrared absorption spectrum peak position a $cm^{-1}$ assigned to Si—O—Si linkages in a range from 1,000 to 1,050 $cm^{-1}$ of the silicone resin and an infrared absorption spectrum peak position b $cm^{-1}$ assigned to Si—O—Si linkages in a range from 950 to 1,050 $cm^{-1}$ of the silicone resin composition after the heat curing satisfy 5<a−b<20.

In one aspect of the present invention, the above conditions may be set to satisfy 8<a−b<20.

In other words, the present invention relates to the following.

[1] A method for producing a semiconductor light-emitting device comprising:

a step of applying a silicone resin composition to a surface of a semiconductor light-emitting element, and a step of forming an encapsulating portion covering the surface of the semiconductor light-emitting element by heat curing the applied silicone resin composition, wherein the silicone resin composition comprises a silicone resin in which the constituent silicon atoms are substantially only silicon atoms to which three oxygen atoms are bonded in an amount of 60% by mass or more relative to a total mass of solid components in the silicone resin composition, and the heat curing is performed under conditions in which an infrared absorption spectrum peak position assigned to Si—O—Si linkages in a range from 1,000 to 1,050 $cm^{-1}$ of the silicone resin before the heat curing is designated a $cm^{-1}$, and an infrared absorption spectrum peak position assigned to Si—O—Si linkages in a range from 950 to 1,050 $cm^{-1}$ of the silicone resin composition after the heat curing is designated b $cm^{-1}$, satisfying 5<a−b<20.

[2] The method for producing a semiconductor light-emitting device according to [1], wherein the conditions satisfy 8<a−b<20.

Effects of the Invention

The production method according to the present invention enables the production of an optical semiconductor light-emitting device provided with an encapsulating portion of improved crack resistance and heat resistance formed from a cured product of the silicone resin composition.

BEST MODE FOR CARRYING OUT THE INVENTION

Figure 1:
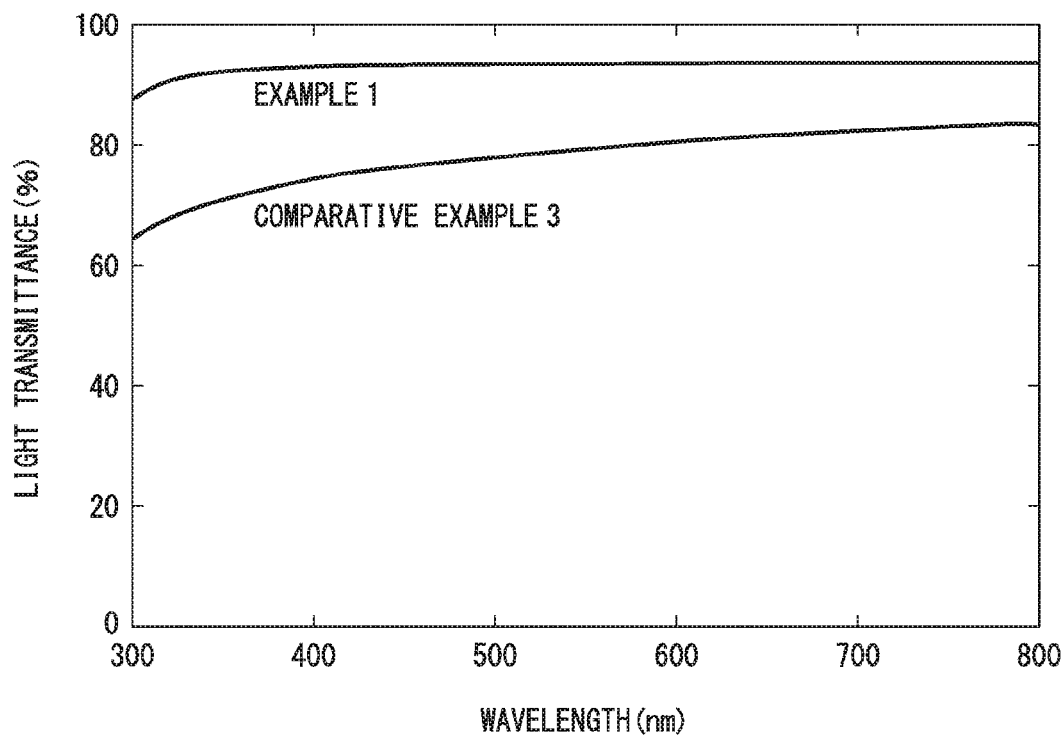
FIG. 1 is a graph illustrating the results of measuring the light transmittance of optical semiconductor encapsulating members according to the present invention.
Figure 2:
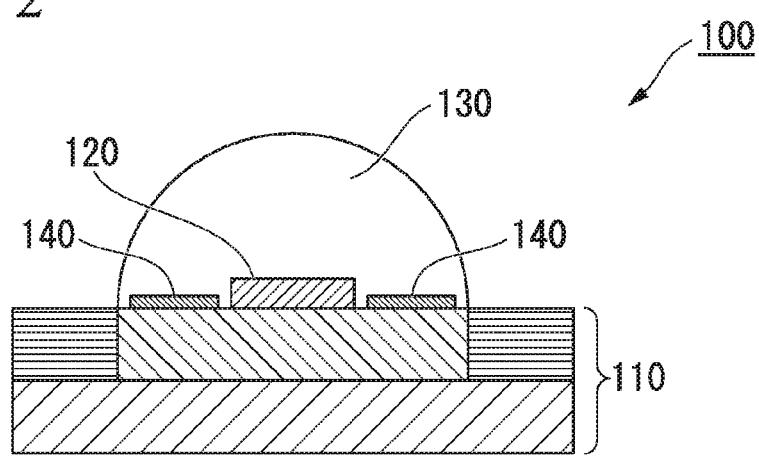
FIG. 2 is cross-sectional view of an optical semiconductor light-emitting device according to the present invention.

The present invention is described below in further detail, but the present invention is in no way limited by the following embodiments, and various modifications are possible within the scope of the present invention.

One embodiment of the present invention provides a method for producing an optical semiconductor light-emitting device that comprises a step of heat curing a silicone resin composition applied to the surface of a semiconductor light-emitting element, thereby forming an encapsulating portion provided covering the surface of the semiconductor light-emitting element, wherein the silicone resin composition comprises a silicone resin in which the constituent silicon atoms are substantially only silicon atoms to which three oxygen atoms are bonded in the amount of 60% by mass or more, and the heat curing is performed under conditions in which the infrared absorption spectrum peak position a cm$^{-1}$ assigned to Si—O—Si linkages in the range from 1,000 to 1,050 cm$^{-1}$ of the silicone resin before the heat curing and the infrared absorption spectrum peak position b cm$^{-1}$ assigned to Si—O—Si linkages in the range from 950 to 1,050 cm$^{-1}$ of the silicone resin composition after the heat curing satisfy 5<a−b<20.

A separate aspect of the present invention is a method for producing an optical semiconductor light-emitting device that comprises: applying a silicone resin composition to the surface of a semiconductor light-emitting element, and forming an encapsulating portion provided covering the surface of the semiconductor light-emitting element by heat curing the applied silicone resin composition, wherein the silicone resin composition comprises a silicone resin in which the constituent silicon atoms are substantially only silicon atoms to which three oxygen atoms are bonded in the amount of 60% by mass or more relative to the total mass of solid components in the silicone resin composition, and the heat curing is performed under conditions in which the infrared absorption peak position assigned to Si—O—Si linkages in the range from 1,000 to 1,050 cm$^{-1}$ of the silicone resin before the heat curing is designated a cm$^{-1}$, and the infrared absorption spectrum peak position assigned to Si—O—Si linkages in the range from 950 to 1,050 cm$^{-1}$ of the silicone resin composition after the curing is designated b cm$^{-1}$, satisfying 5<a−b<20.

In the method for producing an optical semiconductor light-emitting device that represents one embodiment of the present invention, a silicone resin composition comprising a silicone resin in which the constituent silicon atoms are substantially only silicon atoms to which three oxygen atoms are bonded (hereinafter also referred to as "resin A") in the amount of 60% by mass or more is used as the material for forming an encapsulating portion for an optical semiconductor light-emitting device (hereinafter also referred to as an optical semiconductor encapsulating member). Here, "60% by mass or more" means the silicone resin composition comprises the resin A in the amount of 60% by mass or more relative to the total mass of the solid components in the silicone resin composition. The silicone resin composition preferably comprises the resin A in the amount of 80% by mass to 100% by mass, more preferably in the amount of 90% by mass to 100% by mass, and even more preferably in the amount of 95% by mass to 100% by mass, relative to the total mass of the solid components in the silicone resin composition. The silicone resin composition is described below.

[Silicone Resin Composition]
(Silicone Resin)

Silicone resins generally comprise repeating units of the following formulae. In the following formulas, R$^1$ represents an alkyl group or an aryl group, and each R$^2$ independently represents an alkoxy group, alkenyl group, hydrogen atom or hydroxyl group.

[Chemical formula 1]

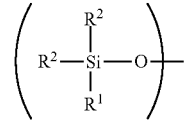
(A1)

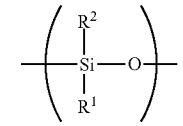
(A2)

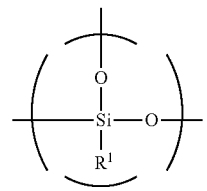
(A3)

In this description, a repeating unit containing a silicon atom bonded to three oxygen atoms bonded to other silicon atoms and also bonded to R$^1$ is described as a repeating unit A3 (represented by the above formula (A3)).

In a similar manner, a repeating unit containing a silicon atom bonded to two oxygen atoms bonded to other silicon atoms and also bonded to R$^1$ and R$^2$ is described as a repeating unit A2 (represented by the above formula (A2)).

Further, a repeating unit containing a silicon atom bonded to one oxygen atom bonded to another silicon atom and also bonded to R$^1$ and two R$^2$ groups is described as a repeating unit A1 (represented by the above formula (A1)).

The repeating unit A1 constitutes the terminal of an organopolysiloxane chain. Further, the repeating unit A3 constitutes a branched structure of one or two organopolysiloxane chains. In other words, the repeating unit A3 forms a portion of a resin network structure or cyclic structure.

The "silicone resin in which the constituent silicon atoms are substantially only silicon atoms to which three oxygen atoms are bonded (resin A)" that is used in the production method that represents one embodiment of the present invention means a silicone resin composed substantially of only one or more repeating units selected from the group consisting of (1) the above repeating unit A3, (2) the above repeating unit A2 in which R$^2$ represents an alkoxy group or a hydroxyl group, and (3) the above repeating unit A1 in which each of the R$^2$ groups represents an alkoxy group or a hydroxyl group.

Here, the term "substantially" permits the incorporation of repeating units other than the abovementioned repeating units (1), (2) and (3) that are difficult to eliminate in the production of the silicone resin. For example, 95 mol % or more of the total number of moles of repeating units constituting the silicone resin are preferably repeating units of the abovementioned (1), (2) and (3).

The resin A preferably has an organopolysiloxane structure represented by the following formula (1).

In the following formula (1), the pluralities of $R^1$ and $R^2$ may each represent the same groups or different groups. In formula (1), each $R^1$ independently represents an alkyl group or an aryl group, each $R^2$ independently represents an alkoxy group or a hydroxyl group, and each of $p^2$, $q^2$, $r^2$, $a^2$ and $b^2$ independently represents an integer of 0 or greater, provided that $p^2$, $q^2$, $r^2$, $a^2$ and $b^2$ are not all 0 simultaneously. The relationship represented by $[a^2 \times q^2]/[(p^2+b^2 \times q^2)+a^2 \times q^2+(r^2+q^2)]=0.5$ to $1.0$ is preferably satisfied.

[Chemical formula 2]

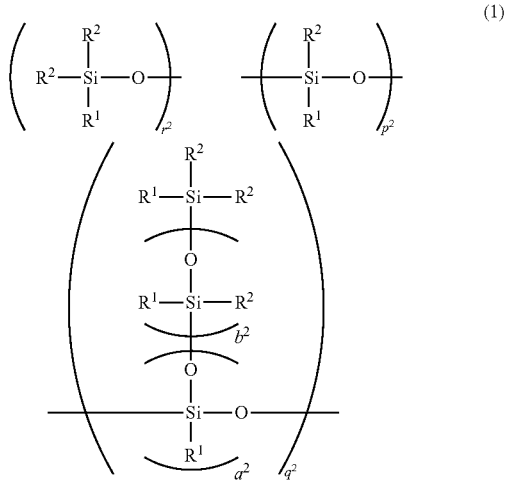

(1)

$R^1$ and $R^2$ in the above formula (1) are described below in further detail.

When $R^1$ is an alkyl group, the alkyl group may be linear, branched, or have a cyclic structure. Further, although there are no particular limitations on the carbon number of the alkyl group, a carbon number of 1 to 10 is preferred, a carbon number of 1 to 6 is more preferred, and a carbon number of 1 to 3 is particularly desirable.

In the alkyl group, one or two of the hydrogen atoms that constitute the group may each be substituted with another group. Examples of this substituent of the alkyl group include aryl groups having a carbon number of 6 to 10, such as a phenyl group or naphthyl group.

Specific examples of the alkyl group represented by $R^1$ include unsubstituted alkyl groups such as a methyl group, ethyl group, propyl group, isopropyl group, butyl group, isobutyl group, tert-butyl group, pentyl group, neopentyl group, hexyl group, octyl group, nonyl group and decyl group, and aralkyl groups such as a phenylmethyl group, phenylethyl group and phenylpropyl group.

When $R^1$ is an aryl group, examples of the aryl group include aryl groups having a carbon number of 6 to 10. Further, one, or two or more hydrogen atoms that constitute the aryl group may each be substituted with another group. Examples of this substituent of the aryl group include alkyl groups having a carbon number of 1 to 6, such as a methyl group, ethyl group, propyl group or butyl group.

Specific examples of the aryl group represented by $R^1$ include unsubstituted aryl groups such as a phenyl group and naphthyl group, and alkylaryl groups such as a methylphenyl group, ethylphenyl group and propylphenyl group.

Each $R^2$ independently represents an alkoxy group or a hydroxyl group. When $R^2$ represents an alkoxy group, the alkoxy group may be linear, branched, or have a cyclic structure. Further, although there are no particular limitations on the carbon number of the alkoxy group, a carbon number of, for example, 1 to 4 is preferred. Specific examples of the alkoxy group represented by $R^2$ include a methoxy group, ethoxy group, propoxy group, isopropoxy group, butoxy group, isobutoxy group and tert-butoxy group.

For the resin A, a resin having an organopolysiloxane structure represented by the above formula (1), having at least one group selected from the group consisting of a methyl group, ethyl group and phenyl group as $R^1$, and having at least one group selected from the group consisting of a methoxy group, ethoxy group, isopropoxy group and hydroxyl group as $R^2$ is preferred; a resin having at least one group selected from the group consisting of a methyl group and an ethyl group as $R^1$, and having at least one group selected from the group consisting of a methoxy group, ethoxy group, isopropoxy group and hydroxyl group as $R^2$ is more preferred; and a resin having at least one group selected from the group consisting of a methyl group and an ethyl group as $R^1$, and having at least one group selected from the group consisting of a methoxy group, ethoxy group and isopropoxy group as $R^2$ is even more preferred.

The weight-average molecular weight of the resin A is, for example, 1,500 to 8,000. When the weight-average molecular weight satisfies this range, the obtained optical semiconductor encapsulating member has improved crack resistance and heat resistance, and tends to also have improved barrier properties relative to hydrogen sulfide gas. The weight-average molecular weight of the resin A is preferably 1,500 to 7,000, and more preferably 2,000 to 5,000.

Generally, a value obtained by measurement by a gel permeation chromatography (GPC) method can be used as the weight-average molecular weight. Specifically, a sample of the polymer that is to be measured is dissolved in a suitable solvent, the solution is then passed through a column using a filler having a multitude of pores together with a mobile phase solution, thereby fractionating the polymer inside the column based on the size of the molecular weight, and the fractionated products are then detected using a detector such as a differential refractometer, UV meter, viscometer or light scattering detector. The weight-average molecular weight is generally expressed as a polystyrene-equivalent value referenced against standard polystyrenes. In this description, weight-average molecular weights are expressed as these polystyrene-equivalent values. The column used may be selected appropriately in accordance with the anticipated molecular weight.

In the GPC measurement, the solvent used for dissolving the silicone resin or silicone oligomer is preferably the same solvent as that used for the mobile phase solvent used during the GPC measurement, and specific examples include tetrahydrofuran, chloroform, toluene, xylene, dichloromethane, dichloroethane, methanol, ethanol and isopropyl alcohol.

The resin A can be synthesized using organosilicon compounds corresponding with each of the abovementioned repeating units and having a functional group that can generate a siloxane linkage as the starting materials. For example, for an organosilicon compound corresponding with the repeating unit A3, an organotrihalosilane or an organotrialkoxysilane or the like can be used as a starting material. The silicone resin can be synthesized by reacting these types of starting materials by a hydrolysis-condensation method or the like in a ratio corresponding with the abundance ratio of each of the repeating units. Further, silicone resins synthesized in this manner are also industrially available.

In the method for producing a semiconductor light-emitting device according to one embodiment of the present invention, provided the silicone resin composition used as the material for the optical semiconductor encapsulating member comprise the resin A in the amount of 60% by mass or more relative to the total mass of solid components in the silicone resin composition, the composition may also comprise other components. Examples of these other components include silicone oligomers, inorganic particles, phosphors, silane coupling agents and curing catalysts.

(Silicone Oligomer)

There are no particular limitations on the silicone oligomer, and examples include oligomers having an organopolysiloxane structure represented by formula (2) shown below. In formula (2), the pluralities of $R^1$ and $R^2$ may each represent the same groups or different groups. In formula (2), each $R^1$ independently represents an alkyl group or an aryl group, each $R^2$ independently represents an alkyl group, aryl group, alkoxy group or hydroxyl group, each $R^3$ independently represents an alkoxy group or a hydroxyl group, and each of $p^2$, $q^2$, $r^2$, $a^2$ and $b^2$ independently represents an integer of 0 or greater, provided that $p^2$, $q^2$, $r^2$, $a^2$ and $b^2$ are not all 0 simultaneously. The value represented by $[p^2+b^2 \times q^2]/[(p^2+b^2 \times q^2)+a^2 \times q^2+(r^2+q^2)]$ is preferably within a range from 0.3 to 0.7.

The alkyl group for $R^1$ is preferably an alkyl group having a carbon number of 1 to 3, and specific examples include a methyl group, ethyl group, propyl group and isopropyl group. The aryl group for $R^1$ is preferably an aryl group having a carbon number of 6 to 10, and specific examples include a phenyl group, naphthyl group and methylphenyl group.

The alkoxy group for $R^1$ is preferably an alkoxy group having a carbon number of 1 to 4, and specific examples include a methoxy group, ethoxy group, propoxy group, isopropoxy group and tert-butoxy group.

The alkoxy group for $R^3$ is preferably an alkoxy group having a carbon number of 1 to 4, and specific examples include a methoxy group, ethoxy group, propoxy group, isopropoxy group and tert-butoxy group.

[Chemical formula 3]

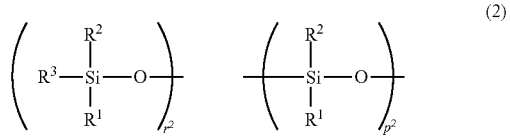

(2)

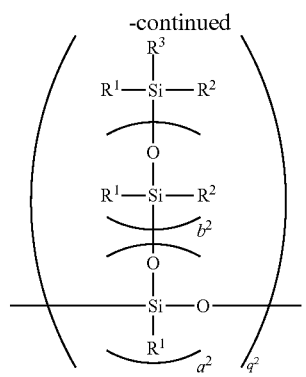

The weight-average molecular weight of the silicone oligomer is, for example, preferably less than 1,500. If the weight-average molecular weight of the silicone oligomer satisfies this range, then the crack resistance of the obtained optical semiconductor encapsulating member tends to improve further. The weight-average molecular weight of the silicone oligomer is preferably 200 to 1,500, and is more preferably 250 to 1,000.

By blending the type of silicone oligomer described above in the silicone resin composition, the crack resistance and the adhesiveness tend to improve, without impairing the gas barrier properties of the optical semiconductor encapsulating member. The reasons why adding the silicone oligomer improves the crack resistance and the adhesiveness to other materials of the obtained optical semiconductor encapsulating member are not entirely clear, but it is surmised that the low-molecular weight silicone oligomer bonds in a manner that facilitates crosslinking between polymer molecules of the resin A, which results in improved flexibility, as well as an increase in the polarity of the overall resin due to the functional groups in the silicone oligomer, thereby enhancing the adhesiveness to other materials.

The silicone oligomer can be synthesized using organosilicon compounds corresponding with each of the above-mentioned repeating units and having a functional group that can generate a siloxane linkage as the starting materials. For example, for an organosilicon compound corresponding with the repeating unit A3, an organotrihalosilane or an organotrialkoxysilane or the like can be used as a starting material. The silicone oligomer can be synthesized by reacting these types of starting materials by a hydrolysis-condensation method or the like in a ratio corresponding with the abundance ratio of each of the repeating units. Further, silicone oligomers synthesized in this manner are also industrially available.

The amount (solid component) of the silicone oligomer is typically 0 to 40 parts by mass per 100 parts by mass of the solid components of the silicone resin composition.

There are no particular limitations on the method used for mixing the resin A and the silicone oligomer, and any conventional method typically used for mixing two or more polymer compounds may be used. For example, the resin A and the silicone oligomer (and other resins as required) can be mixed by simultaneously or sequentially dissolving the components in an organic solvent.

From the viewpoints of enabling more uniform mixing and improving the stability of the resulting resin solution (namely, the solution comprising the dissolved resin A and silicone oligomer), it is preferable that the resin A and the like are first dissolved in an organic solvent having high levels of volatility and dissolution, and the solvent is then substituted with another solvent. Specifically, first, the resin A is added to an organic solvent having high volatility (hereinafter also referred to as the organic solvent P) and is dissolved by heating and stirring the solvent at a temperature close to the boiling point of the organic solvent P. Next, the silicone oligomer is added, mixed and dissolved in a similar manner. Subsequently, a solvent (hereinafter also referred to as the organic solvent Q) having lower volatility than the organic solvent P is added, and a solvent substitution from the organic solvent P to the organic solvent Q is performed by heating the solution until the concentration of the organic solvent P falls to 1% or less. In order to facilitate a more efficient solvent substitution, heating may be performed with the inside of the vessel under a state of reduced pressure.

By performing this type of treatment, residual solvent used during the synthesis of the resin A and the silicone oligomer, and unreacted residual water or the like can also be removed during the solvent substitution, which is effective in improving the stability of the resin solution.

The organic solvent P is preferably an organic solvent having a boiling point of less than 100° C. Specific examples include ketone-based solvents such as acetone and methyl ethyl ketone; alcohol-based solvents such as methanol, ethanol, isopropyl alcohol and normal-propyl alcohol; hydrocarbon-based solvents such as hexane, cyclohexane, heptane and benzene; acetate ester-based solvents such as methyl acetate and ethyl acetate; and ether-based solvents such as diethyl ether and tetrahydrofuran. Among these, alcohol-based solvents are preferable.

The organic solvent Q is preferably an organic solvent having a boiling point of 100° C. or higher. Specific examples include glycol ether-based solvents such as ethylene glycol monomethyl ether, ethylene glycol monoethyl ether, ethylene glycol monoisopropyl ether, ethylene glycol monobutyl ether, ethylene glycol monohexyl ether, ethylene glycol monoethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol monobutyl ether, diethylene glycol monohexyl ether, diethylene glycol monoethylhexyl ether, diethylene glycol monophenyl ether, diethylene glycol monobenzyl ether, propylene glycol monomethyl ether, propylene glycol monoethyl ether, propylene glycol monoisopropyl ether, propylene glycol monobutyl ether, propylene glycol monohexyl ether, propylene glycol monoethylhexyl ether, propylene glycol monophenyl ether, propylene glycol monobenzyl ether, dipropylene glycol monomethyl ether, dipropylene glycol monoethyl ether, dipropylene glycol monoisopropyl ether, dipropylene glycol monobutyl ether, dipropylene glycol monohexyl ether, dipropylene glycol monoethylhexyl ether, dipropylene glycol monophenyl ether and dipropylene glycol monobenzyl ether; and glycol ester-based solvents in which an acetate group has been added to one of the above glycol ether-based solvents, such as ethylene glycol monoethyl ether acetate, ethylene glycol monoisopropyl ether acetate, ethylene glycol monobutyl ether acetate, ethylene glycol monohexyl ether acetate, ethylene glycol monoethylhexyl ether acetate, ethylene glycol monophenyl ether acetate and ethylene glycol monobenzyl ether acetate. Among these, glycol ester-based solvents are preferable.

(Inorganic Particles, Phosphors)

Phosphors which emit fluorescence upon light irradiation and inorganic particles may also be contained in the silicone resin composition. This enables the obtained optical semiconductor encapsulating member to enhance the intensity of the light from the light-emitting element. The inorganic particles scatter light inside the optical semiconductor encapsulating member, thereby effectively exciting the phosphor, and also prevent the phosphor from settling down through the silicone resin composition.

When a phosphor and inorganic particles are mixed into the silicone resin composition, the phosphor is prone to settling, and therefore it is preferable that the inorganic particles are first added and mixed, the phosphor is then mixed, and the composition is then used promptly for encapsulating the optical semiconductor element.

Examples of preferred inorganic particles include oxides of silicon, titanium, zirconium, aluminum, iron and zinc and the like, carbon black, barium titanate, calcium silicate and calcium carbonate. Among these, silicon oxides, titanium oxides and aluminum oxides are particularly preferred.

Examples of the form of the inorganic particles include spherical, plate-like, columnar, needle-like, whisker-like and fibrous particles.

Either one type, or two or more types, of inorganic particle compositions may be used. Further, the inorganic particles preferably comprise inorganic particles having two or more different particle sizes, and more preferably comprise at least two types of particles including inorganic particles A having a primary particle average particle size of 100 to 500 nm and inorganic particles B having a primary particle average particle size of 5 nm or more and less than 100 nm. By comprising two or more types of inorganic particles having different primary particle average particle sizes, the efficiency of the excitation of the phosphor by scattered light can be further improved, and the effect of the inorganic particles in preventing settling of the phosphor can be better realized.

Here, the primary particle average particle size can be determined by an imaging method or the like in which an electron microscope or the like is used to view the particles directly. Specifically, a sample prepared by placing the inorganic particles to be measured into an arbitrary solvent, performing irradiation with ultrasound or the like to thoroughly disperse the particles, and then dripping the liquid onto a slide glass or the like and performing drying, or a sample prepared by adhering the inorganic particles directly to the adhesive surface of an adhesive tape by sprinkling the particles onto the tape, is inspected using a scanning electron microscope (SEM) or a transmission electron microscope (TEM) or the like, and the primary particle average particle size is then determined by calculating the dimensions of the particles from the particle shapes. For example, the projected area of an inorganic particle may be determined, and the diameter of a circle corresponding with that area then calculated and recorded as the particle size. In this case, the particle size is determined for 100 or more particles (and preferably 100 particles), and the arithmetic mean may then be calculated and recorded as the average particle size.

There are no particular limitations on the amount of inorganic particles, and for example, an amount of 0.01 to 100 parts by mass, or 0.1 to 50 parts by mass, per 100 parts by mass of the solid components of the silicone resin composition may be used.

Further, there are no particular limitations on the composition or type of phosphor used, and examples include red phosphors that emit fluorescence in a wavelength range from 570 to 700 nm, green phosphors that emit fluorescence in a wavelength range from 490 to 570 nm, and blue phosphors that emit fluorescence in a wavelength range from 420 to 480 nm. Further, a plurality of phosphors may also be mixed, depending on the brightness or color required. There are no particular limitations on the amount of phosphor used, and the amount may be adjusted appropriately in accordance with factors such as the amount of light emitted by the light-emitting element, and the color and brightness required as a semiconductor light-emitting device. The amount of the phosphor is, for example, preferably 5 to 40 parts by mass per 100 parts by mass of the solid components of the silicone resin composition.

(Silane Coupling Agent)

A silane coupling agent has the effect of improving the adhesion between the cured product of the silicone resin composition and the semiconductor light-emitting element or package. Silane coupling agents having at least one group selected from the group consisting of a vinyl group, epoxy group, styryl group, methacrylic group, acrylic group, amino group, ureido group, mercapto group, sulfide group and isocyanate group are preferable, and of these, coupling agents containing at least one group selected from the group consisting of an epoxy group and a mercapto group are particularly preferred. Specific examples of preferred silane coupling agents include 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, 3-mercaptopropylmethyldimethoxysilane and 3-mercaptopropyltrimethoxysilane.

The amount of the silane coupling agent may be 0.0001 to 1.0 parts by mass, or 0.001 to 0.5 parts by mass, per 100 parts by mass of the solid components of the silicone resin composition.

This silane coupling agent may be mixed into the silicone resin composition, or alternatively, the silane coupling agent may be applied in advance, by coating or an immersion treatment, to the surface of the semiconductor light-emitting element or package, and the silicone resin composition subsequently formed and cured by potting or the like.

(Curing Catalyst)

There are no particular limitations on the curing catalyst, provided it is a curing catalyst capable of promoting the crosslinking reaction of the silicone resin component. Examples of the curing catalyst include inorganic acids such as hydrochloric acid, sulfuric acid, nitric acid and phosphoric acid; organic acids such as formic acid, acetic acid, oxalic acid, citric acid, propionic acid, butyric acid, lactic acid and succinic acid; and alkaline compounds such as ammonium hydroxide, tetramethylammonium hydroxide and tetraethylammonium hydroxide. Among these, phosphoric acid and acetic acid are preferred.

In order to enable the curing catalyst to be added in a prescribed concentration, the curing catalyst may be added to the silicone resin composition in a dilute state within an organic solvent or a silicone monomer or silicone oligomer or the like that is easily blended with the silicone resin composition.

The amount of the curing catalyst may be set as appropriate with due consideration of factors such as the heating temperature during the curing reaction of the silicone resin composition, the reaction time, and the type of catalyst. For example, the amount of the curing catalyst is preferably 0.0005 to 20 parts by mass, and more preferably 0.001 to 10 parts by mass, per 100 parts by mass of the solid components in the silicone resin composition. The curing catalyst may be added to the silicone resin composition immediately prior to performing the curing reaction, or may be contained in the original silicone resin composition.

(Other Additives)

The silicone resin composition may also comprise a modifying silicone compound different from the resin A and the silicone oligomer, as well as other additives.

Examples of the modifying silicone compound include typical silicone compounds available industrially. By adding a modifying silicone compound, for example, flexibility can be imparted to the optical semiconductor encapsulating member.

The amount of the modifying silicone compound in the silicone resin composition is, for example, preferably 0.1 to 20 parts by mass (solid component), and more preferably 0.5 to 10 parts by mass, per 100 parts by mass of the solid components in the silicone resin composition.

Examples of the abovementioned additives include antifoaming agents or the like used for suppressing gas bubble formation during mixing of the silicone resin composition. The amount of such an antifoaming agent in the silicone resin composition is preferably 0.01 to 5 parts by mass (solid component), and more preferably 0.01 to 1 part by mass, per 100 parts by mass of the solid components in the silicone resin composition.

[Step of Heat Curing Silicone Resin Composition]

The silicone resin composition can be heat cured by heating the composition. Examples of the conditions used for heat curing the silicone resin composition include a method that involves heating at 40 to 250° C. for a period of 5 minutes to 6 hours. For example, following addition of a curing catalyst to the silicone resin composition, curing may be performed by leaving the composition to stand in an atmosphere at a temperature of 250° C. or less, for example by leaving the composition to stand in an atmosphere at a temperature of 40 to 200° C. Further, during curing, in order to remove solvents and water that exist in the silicone resin composition, and better control the condensation reaction rate of the silicone resin, the composition may be cured in a stepwise manner, for example at 40 to 60° C. for 5 to 30 minutes, subsequently at 60 to 100° C. for 10 to 60 minutes, and then at 140 to 200° C. for 30 minutes to 5 hours.

The heat curing is performed under conditions in which the infrared absorption spectrum peak position assigned to Si—O—Si linkages in the range from 1,000 to 1,050 $cm^{-1}$ of the stand-alone resin A, which is contained in the silicone resin composition before the heat curing in an amount of 60% by mass or more relative to the total mass of the solid components in the silicone resin composition, is designated a $cm^{-1}$, and the infrared absorption spectrum peak position assigned to Si—O—Si linkages in the range from 950 to 1,050 $cm^{-1}$ of the above silicone resin composition after the heat curing is designated b $cm^{-1}$, satisfying $5<a-b<20$. If $5<a-b$, then the polymerization of the silicone resin in the silicone resin composition may be inadequate, and satisfactory crack resistance tends to be difficult to achieve for the semiconductor light-emitting device encapsulating portion. Further, if $a-b<20$, then satisfactory heat resistance tends to be difficult to achieve for the semiconductor light-emitting device encapsulating portion. In other words, provided that $5<a-b$, polymerization of the silicone resin in the silicone resin composition proceeds satisfactorily, and the crack resistance of the encapsulating portion of the semiconductor light-emitting device is favorable. Further, provided that $a-b<20$, the heat resistance of the encapsulating portion of the semiconductor light-emitting device is favorable. From the viewpoint of further improving the crack resistance of the encapsulating portion of the semiconductor light-emitting device, the above conditions may satisfy $8<a-b<20$.

The abovementioned peak position b $cm^{-1}$ varies depending on the heat curing conditions. For example, by changing the type or the amount added of the curing catalyst, the peak position $b$ cm$^{-1}$ can be changed. The peak position $b$ cm$^{-1}$ can also be changed by altering the temperature of the heat curing. Alternatively, the peak position $b$ cm$^{-1}$ can also be changed by altering the composition of the resin A or the silicone resin composition.

The value of the abovementioned a–b tends to increase under conditions where the silicone resin composition cures more rapidly, such as when the amount of the curing catalyst is increased, or the temperature of the heat curing is raised.

In order to ensure that the above relationship 5<a–b<20 is satisfied, it is effective to control the heat curing step performed in an oven so that the solvent concentration in the oven is 1 vol ppm to 1,000 vol ppm, preferably 1 vol ppm to 500 vol ppm, and more preferably 1 vol ppm to 100 vol ppm. One way in which this solvent concentration may be achieved is to use a forced circulation oven. Further, using an oven in which the fan motor capacity is 0.1 W/L or more relative to the volume inside the oven is also effective. Furthermore, ensuring that the surface area of the oven opening is 0.1 cm$^2$/L to 0.5 cm$^2$/L relative to the volume inside the oven is also effective.

In the production method of the present embodiment, preliminary tests may be conducted to ascertain the conditions required to satisfy 5<a–b<20, with the semiconductor light-emitting device then being produced in accordance with those conditions.

[Encapsulating Portion]

The encapsulating portion is obtained by applying the silicone resin composition to a semiconductor light-emitting element on a substrate, and subsequently curing the applied silicone resin composition. In other words, by using the method for producing a semiconductor light-emitting device according to one embodiment of the present invention, a semiconductor light-emitting device provided with a semiconductor light-emitting element encapsulated with an encapsulating portion can be produced. This encapsulating portion has superior levels of crack resistance and heat resistance, has good adhesiveness to substrates and packages, and exhibits superior barrier properties relative to hydrogen sulfide gas. As a result, a semiconductor light-emitting device in which the semiconductor light-emitting element has been encapsulated with the above encapsulating portion is unlikely to undergo cracking or peeling at the interface with the substrate or package, and also has the advantage that the silver film that functions as the rear reflector of the semiconductor light-emitting element is resistant to discoloration, meaning the device is less likely to suffer any deterioration in brightness over time.

The "semiconductor light-emitting device" described in this description includes elements that emit electromagnetic waves not only in the visible region, but also in the infrared region or the ultraviolet region.

The semiconductor light-emitting device disclosed in this description comprises a substrate, a silver film disposed on the substrate, a semiconductor light-emitting element disposed on the substrate, and an encapsulating portion provided covering the semiconductor light-emitting element.

One aspect of the present invention provides a method for producing a semiconductor light-emitting device including:

a step of applying a silicone resin composition to the surface of a semiconductor light-emitting element, and a step of forming an encapsulating portion provided covering the surface of the semiconductor light-emitting element by heat curing the applied silicone resin composition, wherein the silicone resin composition comprises a silicone resin in which the constituent silicon atoms are substantially only silicon atoms to which three oxygen atoms are bonded in the amount of 60% by mass or more relative to the total mass of the solid components in the silicone resin composition, and the heat curing is performed under conditions in which the infrared absorption spectrum peak position assigned to Si—O—Si linkages in the range from 1,000 to 1,050 cm$^{-1}$ of the silicone resin before the heat curing is designated a cm$^{-1}$, and the infrared absorption spectrum peak position assigned to Si—O—Si linkages in the range from 950 to 1,050 cm$^{-1}$ of the silicone resin composition after the curing is designated $b$ cm$^{-1}$, satisfying 5<a–b<20, and preferably satisfying 8<a–b<20.

Further, in the above method for producing a semiconductor light-emitting device, during the heat curing, the heating temperature is preferably 40 to 250° C., and the heating time is preferably 5 minutes to 6 hours.

EXAMPLES

Examples and comparative examples are presented below to describe specifics of the present invention, but the present invention is in no way limited by the following examples.

Example 1

A resin 1 having an organopolysiloxane structure represented by the above formula (1) (weight-average molecular weight=3,500, a compound of the above formula (1) in which R$^1$ represents a methyl group and R$^2$ represents a methoxy group or a hydroxyl group) was used as the silicone resin. The abundance ratios of the various repeating units of the resin 1 are shown in Table 1. The resin 1 is a silicone resin containing substantially only silicon atoms to which three oxygen atoms are bonded.

TABLE 1

| | Resin 1 | | |
|---|---|---|---|
| Repeating units | (—Si(OCH$_3$)(CH$_3$)—O—) | (—Si(OH)(CH$_3$)—O—) | (—Si(O—)(CH$_3$)—O—) |
| Abundance ratio | 0.08 | 0.15 | 0.77 |

When the infrared absorption spectrum peak position assigned to Si—O—Si linkages in the range from 1,000 to 1,050 cm$^{-1}$ of the resin 1 was measured, the result was 1,016.3 cm$^{-1}$. The infrared absorption spectrum was measured under the following conditions.

<Measurement of Infrared Absorption Spectra>

Apparatus name: model 670 manufactured by Varian Inc.
Attachment: Golden Gate Diamond ATR
Measured wavelengths: 4,000 to 700 cm$^{-1}$
Resolution: 4 cm$^{-1}$
Background measurement: open atmosphere
Number of integrations: 32

A flask fitted with a reflux condenser and installed in a water bath was charged with 354 g of the above resin 1 and 190 g of isopropyl alcohol, and the resin was completely dissolved by stirring the liquid while the isopropyl alcohol was refluxed at a liquid temperature of 80 to 85° C.

Next, 35 g of a resin 2, which is a silicone oligomer having an organopolysiloxane structure represented by the above formula (2) (weight-average molecular weight=450, a compound of the above formula (2) in which $R^1$ represents a methyl group, $R^2$ represents a methoxy group, and $R^3$ represents a methoxy group), was added to the solution of the resin 1, and the resulting mixture was stirred for at least 1 hour to effect dissolution. The abundance ratios of the various repeating units of the resin 2 are shown in Table 2.

TABLE 2

| | Resin 2 | | |
|---|---|---|---|
| Repeating units | $\left(\begin{array}{c} OCH_3 \\ H_3CO-Si-O \\ CH_3 \end{array}\right)$ | $\left(\begin{array}{c} OCH_3 \\ -Si-O- \\ CH_3 \end{array}\right)$ | $\left(\begin{array}{c} Si \\ \| \\ O \\ \| \\ -Si-O- \\ \| \\ CH_3 \end{array}\right)$ |
| Abundance ratio | 0.39 | 0.49 | 0.12 |

Subsequently, 123 g of 2-butoxyethyl acetate as a solvent and 0.1 g of 3-glycidoxypropyltrimethoxysilane as a silane coupling agent were added to the obtained composition, and the resulting mixture was set in an evaporator and left under conditions including a composition temperature of 70° C. and a pressure of 4 kPa, thereby removing the isopropyl alcohol by distillation until the concentration of isopropyl alcohol in the composition was reduced to 1% by mass or less.

Next, 2% by mass of a silicone oligomer represented by formula (3) shown below (wherein n is an integer of 3 to 7) containing 15% by mass of phosphoric acid as a curing catalyst was added to the above composition and stirred and mixed thoroughly to obtain a silicone resin composition.

[Chemical formula 4]

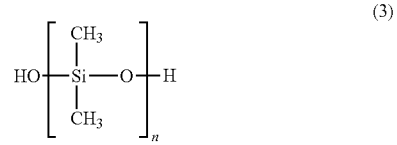

(3)

Subsequently, 3.8 g of the above silicone resin composition was placed in an aluminum cup, the cup was placed in an oven, the temperature was raised to 40° C. over a period of 10 minutes and then held for 10 minutes, and the temperature was then raised to 150° C. over a period of 30 minutes and then held for a further 5 hours, thereby heat curing the silicone resin composition and obtaining an optical semiconductor encapsulating member.

A forced circulation oven was used as the oven. The fan motor capacity was 0.37 W/L relative to the volume inside the oven. The surface area of the oven opening was 0.13 cm²/L relative to the volume inside the oven.

Following completion of the heating at 150° C., the gas inside the oven was sampled, and measurement of the concentration of the 2-butoxyethyl acetate solvent by gas chromatography revealed a result of 74 vol ppm.

When the peak infrared absorption spectrum position assigned to Si—O—Si linkages in the range from 950 to 1,050 $cm^{-1}$ of the optical semiconductor encapsulating member obtained in the example was measured, the result was 1,002.8 $cm^{-1}$. The infrared absorption spectrum was measured in a similar manner to the resin 1.

The difference between the infrared absorption spectrum peak position of the resin 1 and the peak position of the optical semiconductor encapsulating member obtained in this example was 13.5.

Example 2

With the exception of using a resin 3 described below as the silicone resin instead of the resin 1, an optical semiconductor encapsulating member was produced in a similar manner to Example 1.

The resin 3 has an organopolysiloxane structure represented by the above formula (1) (weight-average molecular weight=3,000, a compound of the above formula (1) in which $R^1$ represents a methyl group and $R^2$ represents a hydroxyl group or an ethoxy group). The abundance ratios of the various repeating units of the resin 3 are shown in Table 3. In the table, Me represents a methyl group, and R represents a hydrogen atom or an ethyl group, wherein the abundance ratio between hydrogen atoms and ethyl groups is 96:4.

The resin 3 is a silicone resin containing substantially only silicon atoms to which three oxygen atoms are bonded.

TABLE 3

| | Resin 3 | | |
|---|---|---|---|
| Repeating units | $\left(\begin{array}{c} OR \\ \| \\ RO-Si-O \\ \| \\ Me \end{array}\right)$ | $\left(\begin{array}{c} OR \\ \| \\ -Si-O- \\ \| \\ Me \end{array}\right)$ | $\left(\begin{array}{c} Si \\ \| \\ O \\ \| \\ -Si-O- \\ \| \\ Me \end{array}\right)$ |
| Abundance ratio | 0.01 | 0.26 | 0.73 |

When the infrared absorption spectrum peak position assigned to Si—O—Si linkages in the range from 1,000 to 1,050 $cm^{-1}$ of the resin 3 was measured, the result was 1,018.2 $cm^{-1}$. Further, when the infrared absorption spectrum peak position assigned to Si—O—Si linkages in the range from 950 to 1,050 $cm^{-1}$ of the optical semiconductor encapsulating member obtained in this example was measured, the result was 1,004.7 $cm^{-1}$. The difference between the infrared absorption spectrum peak position of the resin 3 and the peak position of the optical semiconductor encapsulating member obtained in this example was 13.5.

Example 3

With the exception of using a mixture of the resin 1 and a resin D1 described below in a mass ratio of 70:30 as the silicone resin, a semiconductor encapsulating member was produced ins a similar manner to Example 1.

The resin D1 has an organopolysiloxane structure represented by formula (4) shown below (weight-average molecular weight=2,100), and is a compound of the above formula (2) in which $R^1$ represents a methyl group, $R^2$ represents a methyl group, and $R^3$ represents a hydroxyl group.

[Chemical formula 5]

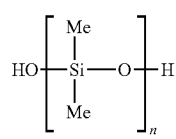

(4)

[In the formula, Me represents a methyl group, and n represents an integer of 1 or more.]

Specifically, a flask fitted with a reflux condenser and installed in a water bath was charged with 70 g of the resin 1 and 32 g of isopropyl alcohol, and the resin was completely dissolved by stirring the liquid while the isopropyl alcohol was refluxed at a liquid temperature of 80 to 85° C. Subsequently, 30 g of the above resin D1 was added to the solution containing the dissolved resin 1 and stirred for at least one hour to dissolve the resin.

Subsequently, 9.9 g of 2-butoxyethyl acetate as a solvent and 0.03 g of 3-glycidoxypropyltrimethoxysilane as a silane coupling agent were added to the obtained composition, and the resulting mixture was set in an evaporator and left under conditions including a composition temperature of 80° C. and a pressure of 4 kPa, thereby removing the isopropyl alcohol by distillation until the concentration of isopropyl alcohol in the composition was reduced to 1% by mass or less.

Next, 2% by mass of the silicone oligomer represented by the above formula (3) (wherein n is an integer of 3 to 7) containing 15% by mass of phosphoric acid as a curing catalyst was added to the above composition and stirred and mixed thoroughly to obtain a silicone resin composition.

Subsequently, 3.8 g of the above silicone resin composition was placed in an aluminum cup, the cup was placed in an oven, the temperature was raised to 40° C. over a period of 10 minutes and then held for 10 minutes, and the temperature was then raised to 150° C. over a period of 30 minutes and then held for a further 5 hours, thereby heat curing the silicone resin composition and obtaining an optical semiconductor encapsulating member.

As already mentioned above, the infrared absorption spectrum peak position assigned to Si—O—Si linkages in the range from 1,000 to 1,050 cm$^{-1}$ of the resin 1 was 1,016.3 cm$^{-1}$. Further, when the infrared absorption spectrum peak position assigned to Si—O—Si linkages in the range from 950 to 1,050 cm$^{-1}$ of the optical semiconductor encapsulating member obtained in this example was measured, the result was 1,004.7 cm$^{-1}$. The difference between the infrared absorption spectrum peak position of the resin 1 and the peak position of the optical semiconductor encapsulating member obtained in this example was 11.6.

Example 4

With the exception of using a mixture of the resin 1 and the resin D1 in a mass ratio of 60:40 as the silicone resin, a semiconductor encapsulating member was produced in a similar manner to Example 3.

Specifically, 60 g of the resin 1 was used instead of the 70 g of the resin 1 used in Example 3, and 40 g of the resin D1 was used instead of the 30 g of the resin D1 used in Example 3.

As already mentioned above, the infrared absorption spectrum peak position assigned to Si—O—Si linkages in the range from 1,000 to 1,050 cm$^{-1}$ of the resin 1 was 1,016.3 cm$^{-1}$. Further, when the infrared absorption spectrum peak position assigned to Si—O—Si linkages in the range from 950 to 1,050 cm$^{-1}$ of the optical semiconductor encapsulating member obtained in this example was measured, the result was 1,004.7 cm$^{-1}$. The difference between the infrared absorption spectrum peak position of the resin 1 and the peak position of the optical semiconductor encapsulating member obtained in this example was 11.6.

Comparative Example 1

With the exception of using a resin 4 described below as the silicone resin instead of the resin 1, an optical semiconductor encapsulating member was produced in a similar manner to Example 1.

The resin 4 has an organopolysiloxane structure represented by the above formula (1) (weight-average molecular weight=7,200, a compound of the formula (1) in which $R^1$ represents a methyl group and $R^2$ represents a hydroxyl group or a methoxy group). The abundance ratios of the various repeating units of the resin 4 are shown in Table 4. In the table, Me represents a methyl group, and R represents a hydrogen atom or a methyl group, wherein the abundance ratio between hydrogen atoms and methyl groups is 76:24.

TABLE 4

| | Resin 4 | |
|---|---|---|
| Repeating units | ![OR/Si/Me unit] | ![Si/O/Si/Me unit] |
| Abundance ratio | 0.25 | 0.75 |

When the infrared absorption spectrum peak position assigned to Si—O—Si linkages in the range from 1,000 to 1,050 cm$^{-1}$ of the resin 4 was measured, the result was 1,006.7 cm$^{-1}$. Further, when the infrared absorption spectrum peak position assigned to Si—O—Si linkages in the range from 950 to 1,050 cm$^{-1}$ of the optical semiconductor encapsulating member obtained in this comparative example was measured, the result was 1,004.7 cm$^{-1}$. The difference between the infrared absorption spectrum peak position of the resin 4 and the peak position of the optical semiconductor encapsulating member obtained in this comparative example was 2.0.

Comparative Example 2

With the exception of using a resin 5 described below as the silicone resin instead of the resin 1, an optical semiconductor encapsulating member was produced in a similar manner to Example 1.

The resin 5 contains the various repeating units shown in Table 5 in the respective abundance ratios shown in Table 5 (weight-average molecular weight=58,300).

TABLE 5

| Resin 5 | | |
|---|---|---|
| Repeating units | $\left(\begin{array}{c} \text{Me} \\ | \\ \text{Me}—\text{Si}—\text{O} \\ | \\ \text{Me} \end{array}\right)$ | $\left(\begin{array}{c} \text{Si} \\ | \\ \text{O} \\ | \\ —\text{Si}—\text{O}— \\ | \\ \text{Me} \end{array}\right)$ |
| Abundance ratio | 0.14 | 0.86 |

[In the formulas, Me represents a methyl group]

When the infrared absorption spectrum peak position assigned to Si—O—Si linkages in the range from 1,000 to 1,050 cm$^{-1}$ of the resin 6 was measured, the result was 1,016.3 cm$^{-1}$. Further, when the infrared absorption spectrum peak position assigned to Si—O—Si linkages in the range from 950 to 1,050 cm$^{-1}$ of the optical semiconductor encapsulating member obtained in this comparative example was measured, the result was 1,012.4 cm$^{-1}$. The difference between the infrared absorption spectrum peak position of the resin 6 and the peak position of the optical semiconductor encapsulating member obtained in this comparative example was 3.9.

Comparative Example 3

With the exception of using a resin 6 described below as the silicone resin instead of the resin 1, an optical semiconductor encapsulating member was produced in a similar manner to Example 1.

The resin 6 has an organopolysiloxane structure represented by the above formula (1) (weight-average molecular weight=2,300, a compound of the formula (1) in which R$^1$ represents a methyl group and R$^2$ represents a hydroxyl group or an ethoxy group). The abundance ratios of the various repeating units of the resin 6 are shown in Table 6. In the table, Me represents a methyl group, and R represents a hydrogen atom or an ethyl group, wherein the abundance ratio between hydrogen atoms and ethyl groups is 90:10. The resin 6 is a silicone resin containing substantially only silicon atoms to which three oxygen atoms are bonded.

TABLE 6

| Resin 6 | | | |
|---|---|---|---|
| Repeating units | $\left(\begin{array}{c} \text{OR} \\ | \\ \text{RO}—\text{Si}—\text{O} \\ | \\ \text{Me} \end{array}\right)$ | $\left(\begin{array}{c} \text{OR} \\ | \\ —\text{Si}—\text{O}— \\ | \\ \text{Me} \end{array}\right)$ | $\left(\begin{array}{c} \text{Si} \\ | \\ \text{O} \\ | \\ —\text{Si}—\text{O}— \\ | \\ \text{Me} \end{array}\right)$ |
| Abundance ratio | 0.02 | 0.47 | 0.51 |

When the infrared absorption spectrum peak position assigned to Si—O—Si linkages in the range from 1,000 to 1,050 cm$^{-1}$ of the resin 6 was measured, the result was 1,022.1 cm$^{-1}$. Further, when the infrared absorption spectrum peak position assigned to Si—O—Si linkages in the range from 950 to 1,050 cm$^{-1}$ of the optical semiconductor encapsulating member obtained in this comparative example was measured, the result was 1,000.9 cm$^{-1}$. The difference between the infrared absorption spectrum peak position of the resin 6 and the peak position of the optical semiconductor encapsulating member obtained in this comparative example was 21.2.

Examples 5 to 9

With the exception of altering the amount of the curing catalyst as shown in Table 8, optical semiconductor encapsulating members were obtained in a similar manner to Example 1. The silicone oligomer represented by formula (3) shown above (wherein n is an integer of 3 to 7) containing 15% by mass of phosphoric acid as a catalyst was used as the curing catalyst.

Examples 10 and 11

With the exceptions of altering the amount of the curing catalyst as shown in Table 8, and performing the heat curing in the manner described below, optical semiconductor encapsulating members were obtained in a similar manner to Example 1. The silicone oligomer represented by formula (3) shown above (wherein n is an integer of 3 to 7) containing 15% by mass of phosphoric acid as a catalyst was used as the curing catalyst.

In Table 8, the amount added of the catalyst indicates the mass % of the catalyst (solid component) relative to the silicone resin composition (including the solvent).

The heat curing was performed by raising the temperature inside the oven to 40° C. over a period of 10 minutes and then holding for 10 minutes, and subsequently raising the temperature to 200° C. over a period of 30 minutes and holding that temperature for a further 5 hours.

Examples 12 to 17

With the exception of altering the amount of the curing catalyst as shown in Table 8, optical semiconductor encapsulating members were obtained in a similar manner to Example 1. A methanol solution containing 0.5% by mass of aluminum acetylacetonate (343-00082, manufactured by Wako Pure Chemical Industries, Ltd.) was used as the curing catalyst.

Examples 18 to 22

With the exception of altering the amount of the curing catalyst as shown in Table 8, optical semiconductor encapsulating members were obtained in a similar manner to Example 1. A 2-butoxyethyl acetate solution containing 15% by mass of a mixture of dimethyl phosphate and monomethyl phosphate (product name: AP-1, manufactured by Daihachi Chemical Industry Co., Ltd.) was used as the curing catalyst.

Example 23

A 2-butoxyethyl acetate solution containing 15% by mass of a mixture of dimethyl phosphate and monomethyl phosphate (product name: AP-1, manufactured by Daihachi Chemical Industry Co., Ltd.) was used as the curing catalyst, and this curing catalyst (solution) was added in an amount of 2% by mass relative to the silicone resin composition (including the solvent). In terms of the catalyst (solid component), this is the equivalent of adding 0.02× 0.15=0.003 (0.3% by mass) relative to the silicone resin composition (including the solvent). Subsequently, with the exception of performing the heat curing of the silicone resin composition in the manner described below, an optical semiconductor encapsulating member was obtained in a similar manner to Example 1.

The heat curing was performed by raising the temperature inside the oven to 40° C. over a period of 10 minutes and then holding for 10 minutes, and subsequently raising the temperature to 200° C. over a period of 30 minutes and holding that temperature for a further 5 hours.

(Evaluation of Crack Resistance)

For each of the optical semiconductor encapsulating members of Examples 1 to 23 and Comparative Examples 1 to 3, the crack resistance was evaluated by inspecting the optical semiconductor encapsulating member after retrieval from the oven. The evaluation criteria for the crack resistance were as follows. The results are shown in Table 7 and Table 8.

A: no cracking occurred in the optical semiconductor encapsulating member

B: cracking occurred in the optical semiconductor encapsulating member, and the encapsulating member was unable to be removed satisfactorily from the aluminum cup (Evaluation of Heat Resistance)

For each of the optical semiconductor encapsulating members of Examples 1 to 4 and Comparative Examples 1 to 3, the heat resistance was evaluated in the following manner. Each optical semiconductor encapsulating member was placed in an oven, and the temperature was raised to 200° C. over a period of 60 minutes and then held for 60 hours. Subsequently, the optical semiconductor encapsulating member was inspected visually and evaluated for heat resistance.

The evaluation criteria for the heat resistance were as follows. The results are shown in Table 7 and Table 8.

A: no change was observed in the optical semiconductor encapsulating member

B: cloudiness was observed in the optical semiconductor encapsulating member

Further, FIG. 1 is a graph of the results of measuring the light transmittance of the optical semiconductor encapsulating members of Example 1 and Comparative Example 3. The light transmittance was measured under the following conditions.

<Light Transmittance Measurements>

Apparatus name: UV-3600 manufactured by Shimadzu Corporation

Attachment: Integrating sphere ISR-3100

Wavelengths measured: 220 to 800 nm

Background: open atmosphere

Measurement rate: medium

TABLE 7

| | Resin A | Proportion of resin A in silicone resin composition (% by mass) | Infrared absorption spectrum peak position a ($cm^{-1}$) of resin A | Infrared absorption spectrum peak position b ($cm^{-1}$) of optical semiconductor encapsulating member | a − b ($cm^{-1}$) | Crack resistance | Heat resistance |
|---|---|---|---|---|---|---|---|
| Example 1 | Resin 1 | 90% | 1016.3 | 1002.8 | 13.5 | A | A |
| Example 2 | Resin 3 | 90% | 1018.2 | 1004.7 | 13.5 | A | A |
| Example 3 | Resin 1 | 70% | 1016.3 | 1004.7 | 11.6 | A | A |
| Example 4 | Resin 1 | 60% | 1016.3 | 1012.4 | 11.6 | A | A |
| Comparative Example 1 | Resin 4 | 90% | 1006.7 | 1004.7 | 2.0 | B | — |
| Comparative Example 2 | Resin 5 | 90% | 1016.3 | 1012.4 | 3.9 | B | — |
| Comparative Example 3 | Resin 6 | 90% | 1022.1 | 1000.9 | 21.2 | A | B |

TABLE 8

| | Heating temperature in heat curing step | Amount added of catalyst (% by mass) | Infrared absorption spectrum peak position a ($cm^{-1}$) of resin A | Infrared absorption spectrum peak position b ($cm^{-1}$) of optical semiconductor encapsulating member | a − b ($cm^{-1}$) | Crack resistance |
|---|---|---|---|---|---|---|
| Example 5 | 150° C. | 0 | 1016.3 | 1010.5 | 5.8 | A |
| Example 6 | 150° C. | 0.15 | | 1006.7 | 9.6 | A |
| Example 7 | 150° C. | 0.30 | | 1002.8 | 13.5 | A |
| Example 8 | 150° C. | 0.45 | | 1002.8 | 13.5 | A |
| Example 9 | 150° C. | 0.75 | | 1004.7 | 11.6 | A |
| Example 10 | 200° C. | 0 | | 1002.8 | 13.5 | A |
| Example 11 | 200° C. | 0.30 | | 1000.9 | 15.4 | A |
| Example 12 | 150° C. | 0 | | 1010.5 | 5.8 | A |
| Example 13 | 150° C. | 0.001 | | 1006.7 | 9.6 | A |
| Example 14 | 150° C. | 0.0025 | | 1006.7 | 9.6 | A |
| Example 15 | 150° C. | 0.005 | | 1004.7 | 11.6 | A |
| Example 16 | 150° C. | 0.01 | | 1002.8 | 13.5 | A |
| Example 17 | 150° C. | 0.025 | | 1002.8 | 13.5 | A |
| Example 18 | 150° C. | 0 | | 1010.5 | 5.8 | A |
| Example 19 | 150° C. | 0.15 | | 1006.7 | 9.6 | A |
| Example 20 | 150° C. | 0.30 | | 1002.8 | 13.5 | A |
| Example 21 | 150° C. | 0.45 | | 1002.8 | 13.5 | A |
| Example 22 | 150° C. | 0.75 | | 1002.8 | 13.5 | A |
| Example 23 | 200° C. | 0.30 | | 1000.9 | 15.4 | A |

INDUSTRIAL APPLICABILITY

The present invention is able to provide a method for producing an optical semiconductor light-emitting device which provides an encapsulating portion of improved crack resistance and heat resistance formed from a cured product of a silicone resin composition, and is therefore extremely useful industrially.

DESCRIPTION OF THE REFERENCE SIGNS

100: Semiconductor light-emitting device
110: Substrate
120: Semiconductor light-emitting element
130: Encapsulating portion
140: Silver film

The invention claimed is:

1. A method for producing a semiconductor light-emitting device comprising:
   a step of applying a silicone resin composition to a surface of a semiconductor light-emitting element, and
   a step of forming an encapsulating portion covering the surface of the semiconductor light-emitting element by heat curing the applied silicone resin composition, wherein
   the silicone resin composition comprises a silicone resin having an organopolysiloxane structure represented by formula (1) in which the constituent silicon atoms are substantially only silicon atoms to which three oxygen atoms are bonded in an amount of 60% by mass or more relative to a total mass of solid components in the silicone resin composition, and
   the heat curing is performed under conditions in which an infrared absorption spectrum peak position assigned to Si—O—Si linkages in a range from 1,000 to 1,050 cm$^{-1}$ of the silicone resin before the heat curing is designated a cm$^{-1}$, and an infrared absorption spectrum peak position assigned to Si—O—Si linkages in a range from 950 to 1,050 cm$^{-1}$ of the silicone resin composition after the heat curing is designated b cm$^{-1}$, satisfying 5<a−b<20:

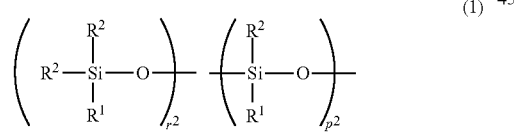

(1)

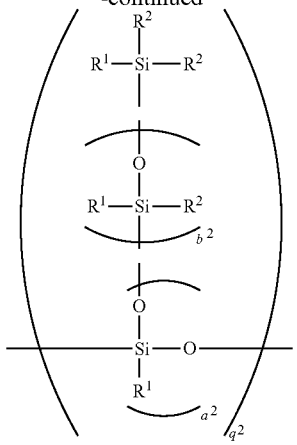

wherein each $R^1$ independently represents an alkyl group or an aryl group, each $R^2$ independently represents an alkoxy group or a hydroxyl group, pluralities of $R^1$ and $R^2$ may be the same or different, each of $p^2$, $q^2$, $r^2$, $a^2$ and $b^2$ independently represents an integer of 0 or greater, and $[a^2 \times q^2]/[(p^2+b^2 \times q^2)+a^2 \times q^2+(r^2+q^2)]$ is 0.5 to less than 1.0.

2. The method for producing a semiconductor light-emitting device according to claim 1, wherein the conditions satisfy 8<a−b<20.

3. A method for producing a semiconductor light-emitting device comprising:
   a step of applying a silicone resin composition to a surface of a semiconductor light-emitting element, and
   a step of forming an encapsulating portion covering the surface of the semiconductor light-emitting element by heat curing the applied silicone resin composition, wherein
   the silicone resin composition comprises a silicone resin in which the constituent silicon atoms are substantially only silicon atoms to which three oxygen atoms are bonded in an amount of 90% by mass or more relative to a total mass of solid components in the silicone resin composition, and
   the heat curing is performed under conditions in which an infrared absorption spectrum peak position assigned to Si—O—Si linkages in a range from 1,000 to 1,050 cm$^{-1}$ of the silicone resin before the heat curing is designated a cm$^{-1}$, and an infrared absorption spectrum peak position assigned to Si—O—Si linkages in a range from 950 to 1,050 cm$^{-1}$ of the silicone resin composition after the heat curing is designated b cm$^{-1}$, satisfying 5<a−b<20.

* * * * *